United States Patent [19]

Elarde et al.

[11] 3,932,253

[45] Jan. 13, 1976

[54] METHOD FOR FORMING A MAGNET PATTERN ON MAGNETIC MEMORY CIRCUIT CARDS

[75] Inventors: Paul F. Elarde, Naperville; F. A. Klasek, LaGrange Park; George O. McCormick, LaGrange, all of Ill.

[73] Assignee: Western Electric Company, Inc., New York, N.Y.

[22] Filed: June 3, 1974

[21] Appl. No.: 476,118

[52] U.S. Cl. .................. 156/249; 29/432; 29/604; 29/609; 29/625; 83/51; 156/252; 156/261; 156/265; 156/293; 156/298; 156/581; 174/68.5; 428/900; 428/901

[51] Int. Cl.² .............. B32B 31/20; B32B 31/12; B41M 3/08; H05K 1/00

[58] Field of Search ........................... 156/233–235, 156/237, 241, 250–253, 261, 265, 293, 298, 303.1, 581; 117/68.5; 83/176, 20, 21, 51; 29/625–627, 432, 609, 604; 174/68.5; 428/900, 901

[56] References Cited

UNITED STATES PATENTS

| | | | |
|---|---|---|---|
| 2,033,553 | 3/1936 | Scholl | 156/261 |
| 2,367,490 | 1/1945 | Ducklo | 156/265 |
| 2,969,300 | 1/1961 | Franz | 156/233 |
| 3,301,730 | 1/1967 | Spiwak et al. | 156/267 |
| 3,547,724 | 12/1970 | Zagusta | 156/253 X |
| 3,554,832 | 1/1971 | Fischer, Jr. | 156/241 X |
| 3,678,577 | 7/1972 | Weglin et al. | 156/251 X |
| 3,809,597 | 5/1974 | Connett | 156/241 X |
| 3,847,700 | 11/1974 | Dalal | 156/252 |

*Primary Examiner*—William A. Powell
*Assistant Examiner*—Thomas Bokan
*Attorney, Agent, or Firm*—R. A. Lloyd

[57] ABSTRACT

A sheet of magnetic material is placed over a surface of a malleable carrier and stuck with a multi-projectioned punch. Each projection of the punch removes a wafer of the magnetic material from the sheet of magnetic material, and embeds the wafer into the carrier to form a pattern of magnetic material wafers in the surface of the carrier. The carrier is then positioned, wafer bearing side down, over an adhesive coated surface of a substrate, and a surface of the carrier, opposite from the wafer bearing surface, is struck with a multiprojectioned punch to force with each projection an individual one of the wafers out of the surface of the carrier and into the adhesive on the substrate. The malleable carrier is then peeled from the adhesive coated surface of the substrate and from the wafers secured thereto, to leave on the surface of the substrate the pattern of magnetic material wafers.

10 Claims, 4 Drawing Figures

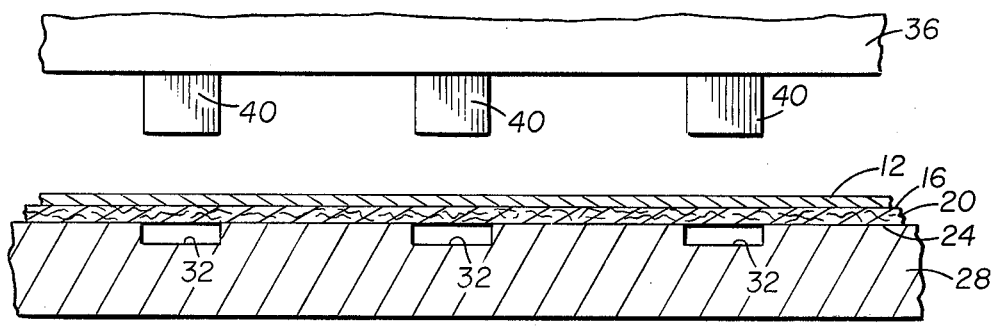
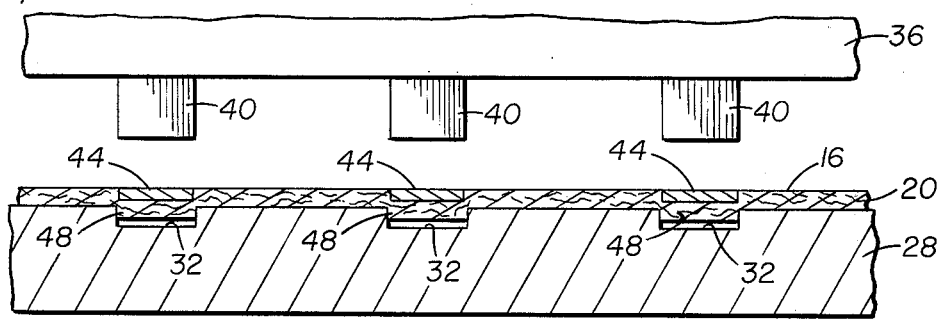
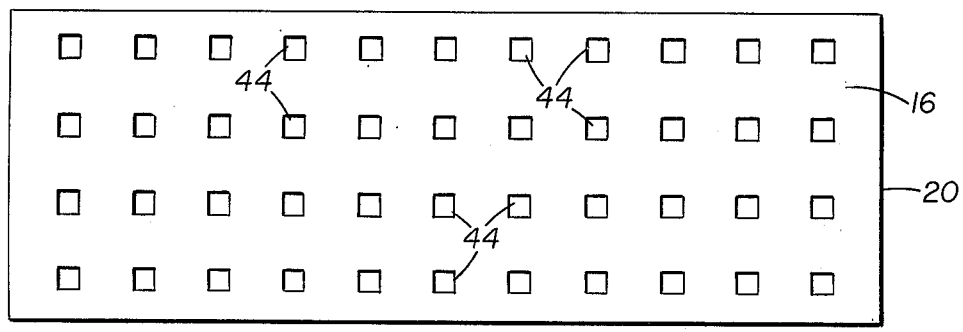
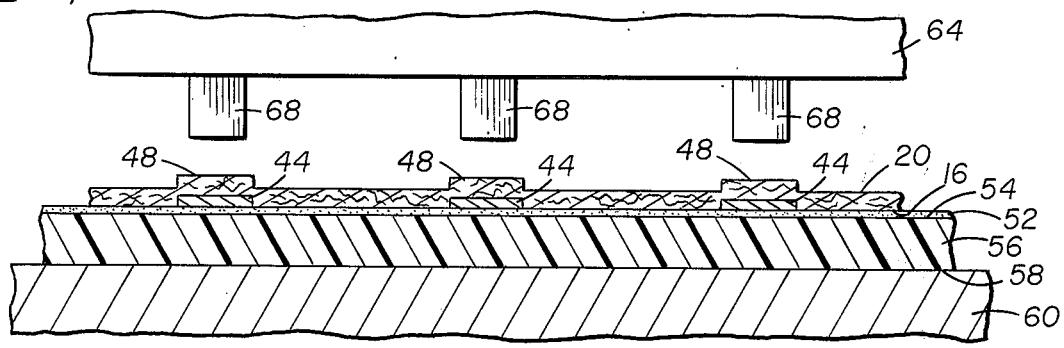

METHOD FOR FORMING A MAGNET PATTERN ON MAGNETIC MEMORY CIRCUIT CARDS

BACKGROUND OF THE INVENTION

1. Field of the Invention

The present invention relates to a method of forming a pattern of a first material on a surface of a second material, and in particular to a method of punch or press forming a pattern of the first material in a surface of a carrier material, and of then punch or press transferring the pattern from the surface of the carrier material to the surface of the second material.

2. Description of the Prior Art

In manufacturing magnetic memory circuit cards, wafers of vicalloy are formed at preselected locations on a surface of a substrate, which is generally comprised of aluminum, and wires are then extended across the wafers to permit electrical pulses to "read" information stored on the wafers. Vicalloy is a generic term (p. 405, *Ferromagnetism* by Bozarth, 1st ed., pub. 1951 by Van Norsten), used to designate those materials typically comprised of 52% cobalt, 37.25% iron, 10% vanadium, 0.050% manganese and 0.026% silicon, and is laminated on an aluminum substrate for manufacturing magnetic memory cards.

In one common manufacturing process a resist pattern, which outlines the wafers, or magnets, is applied by heretofore known techniques on the exposed vicalloy surface. During ensuing processing, approximately 92% of the vicalloy is dissolved in an aqueous etchant solution comprised of ammonium persulfate (a powerful oxidizing agent) highly acidified with sulfuric acid, for leaving a magnet wafer pattern on the substrate. Except that the etched silicon will precipitate from the etchant in the form of silicon dioxide, the spent etchant will contain dissolved salts of all of the other foregoing metals of vicalloy.

Such a process for forming a pattern of vicalloy wafers on a substrate has certain disadvantages. One disadvantage, for example, is that the process of forming the magnet pattern, i.e., laminating, resist patterning and etching, is time consuming and expensive. Another is that the ammonium persulfate spent as etchant has an impurity concentration exceeding that which will permit disposal thereof in a sewer, and must therefore be depurated prior to disposal, also an expensive and time consuming procedure, not to mention that 92% of the vicalloy, a reasonably expensive material, is wasted.

A technique which overcomes the disadvantages of fabricating magnetic memory cards by etching vicalloy is set forth in U.S. Pat. No. 3,847,700, which issued on Nov. 12, 1974, based upon an application filed Nov. 17, 1972, and which is assigned to the assignee of the present invention. In that application, a magnetic memory circuit card is fabricated by positioning a thin sheet of vicalloy material over a surface of either an aluminum or an epoxy glass substrate, and by striking the sheet of vicalloy with a multiprojectioned punch to embed wafers of the vicalloy material into the surface of the substrate in a desired pattern. If the substrate is made of aluminum, warping of the substrate may occur when the wafers are embedded therein, which requires that the substrate be flattened, or straightened, for use in a magnetic memory circuit card. If the substrate is of an epoxy glass material, warping of the substrate does not occur when vicalloy wafers are embedded therein, or if a slight degree of warping does occur the substrate, with the wafers embedded therein, may readily be straightened by being pressed between a pair of flat, heated plates. The use of an aluminum substrate is preferred, however, in the fabrication of a magnetic memory circuit card, in that the switching characteristics exhibited by a wafer embedded in the aluminum substrate are enhanced by the generation of eddy-currents in the aluminum substrate when a wafer embedded therein is pulsed with a current through a wire extended thereacross.

Another technique for forming a pattern of a metal on a surface of a substrate is disclosed in U.S. Pat. No. 2,969,300, which issued on Jan. 24, 1961, to E. E. Franz. This technique contemplates positioning a thin sheet of the metal over an adhesive coated surface of a resilient tape, and striking the metal sheet with a punch to remove a pattern of metal from the sheet and to position the pattern in the adhesive on the tape. The tape is then positioned adhesive side down, and therefore metallic pattern side down, over an adhesive coated surface of the substrate. The tape and the substrate are then pressed together and heated to cure the adhesive, and the tape is then peeled away from the substrate to leave behind the metallic pattern, embedded in the adhesive on the surface of the substrate, on the substrate.

A disadvantage of this technique is that the metallic pattern on the surface of the substrate is contaminated on the upper surface thereof with the adhesive that was on the tape when the pattern was initially adhesively secured thereto, which could render the pattern bearing substrate unsuitable for certain electronic uses. Also, if this technique were employed in the fabrication of magnetic memory circuit cards, such that a sheet of vicalloy positioned over an adhesive coated surface of a paper tape is struck with a multiprojectioned punch to embed wafers of the vicalloy material into the adhesive on the tape in a desired pattern, the wafers could "swim" in the adhesive on the tape and lose their positioning with respect to each other, and thereby move out of a desired pattern. Thereafter, when the wafers are transferred to an adhesive coated surface of a substrate, they would not be on the surface of the substrate in the desired pattern, which would render the substrate unsuitable for use as a component in a magnetic memory circuit card since each wafer on the substrate must be in a precise position with respect to every other wafer so that it will underlie a selected one or more of a plurality of wires which are extended across the surface of the substrate in a predetermined position with respect to the wafers.

SUMMARY OF THE INVENTION

In accordance with the present invention, a pattern of a first material is formed on an adhesive coated surface of a second material by pressing the pattern of the first material against a surface of a sheet of malleable material to deform the malleable material to secure the pattern within the surface thereof. The pattern bearing surface of the malleable material is then placed over the adhesive coated surface of the second material, and a surface of the malleable material, opposite from the pattern bearing surface, is pressed to force the pattern of the first material from the surface of the malleable material and into the adhesive on the surface of the second material.

In a preferred embodiment of the invention, a circuit card, of the type wherein a circuit pattern of discrete wafers of a magnetic material are secured on an adhesive coated surface of a substrate having a magnetic permeability which is insignificant with respect to the permeability of the wafers, is manufactured by positioning a sheet of a malleable carrier material between a punch having a raised pattern in the form of the circuit pattern, and a rigid, planar die having apertures formed therein in the form of the circuit pattern and in alignment with the corresponding raised pattern of the punch for cooperation therewith. A sheet of magnetic material is positioned between the punch and a first surface of the carrier material in an essentially planar relationship with the carrier material, and the punch and the die are moved relative to and toward each other to apply the pattern of the punch against the sheet of magnetic material to cut the circuit pattern of discrete wafers therefrom as the sheet is pressed between the pattern of the punch and the carrier material, to embed the circuit pattern of wafers into the surface of the carrier by displacing the carrier material therebeneath, to secure the circuit pattern therein by deforming the carrier material to compressively surround the edges of the wafers, and to extrude displaced portions of an opposite second surface of the carrier material, underlying the embedded circuit pattern of wafers, into the apertures formed in the die.

The wafer embedded first surface of the carrier material is then placed over the adhesive coated surface of the substrate in an essentially planar relationship therewith, and the carrier material and the substrate are positioned between a punch and a die with a surface of the substrate, opposite from the adhesive coated surface, resting on the die, and with the punch having a raised pattern in a form to engage the second surface of the malleable material at the displaced portions thereof over areas opposite from the circuit pattern on the first surface thereof. The punch and the die are then moved relative to and toward each other to apply the pattern of the punch against the displaced portions on the second surface of the carrier to force the wafers from the first surface thereof and into the adhesive on the surface of the substrate as the carrier is pressed between the pattern of the punch and the substrate, and to move the wafers through the adhesive and into engagement with the surface of the substrate to adhesively secure the wafers to the surface of the substrate. Next, the carrier material is removed from the adhesive coated surface of the substrate to strip the wafers, adhesively secured to the substrate, from the first surface of the carrier, whereby the circuit pattern of discrete wafers of the magnetic material is adhesively secured to the surface of the substrate.

In another aspect of the invention, the adhesive on the substrate is a type which is curable upon being subjected to heat, and after the carrier material has been removed from the substrate, the substrate with the wafers adhesively secured to the surface thereof is heated to cure the adhesive to securely affix the wafers to the substrate, and a sealer is applied across the wafers on the surface of the substrate.

BRIEF DESCRIPTION OF THE DRAWINGS

FIG. 1 is a cross-sectional view of a sheet of magnetic material overlying a malleable carrier, both of which are positioned between a punch and a die in accordance with one step in the practice of the invention;

FIG. 2 is a cross-sectional view of the carrier with wafers of the magnetic matterial embedded therein by the punch;

FIG. 3 is a top view of the carrier with the wafers of the magnetic material embedded therein, and FIG. 4 shows the wafer embedded carrier positioned wafer side down on an adhesive coated surface of a substrate, the carrier and the substrate both being positioned between a punch and a die.

Detailed Description

Referring to FIG. 1, there is shown a flat, thin sheet of magnetic material 12 positioned across one surface 16 of a readily deformable, or malleable, carrier 20. An opposite surface 24 of the carrier 20 rests upon an unheated, or ambient temperature die 28 having a plurality of apertures 32 formed therein. Positioned above the sheet of magnetic material 12 is an unheated, or ambient temperature, multiprojectioned steel punch 36 having a raised pattern in the form of projections 40 in alignment with individual ones of the apertures 32 in the die 28. The punch 36 operates in response to actuation of a press (not shown) to embed, as will be described, a pattern of wafers of the magnetic material 12 into the surface 16 of the carrier 20.

The carrier 20 may be any malleable material, such as a sheet of heavy paper, which is sufficiently deformable, or malleable, to receive within the surface 16 thereof a wafer of the magnetic material 12 upon actuation of the punch 36. The sheet of magnetic material 12 may be comprised of any material having a relatively high magnetic permeability, and in the description of the invention shall be regarded as being a vicalloy material which is mainly comprised of cobalt, iron and vanadium, with traces of manganese and silicon. Preferably, the die 28 is comprised of a malleable material such as brass, and the apertures 32 are readily formed on a planar surface thereof by striking the surface with the steel projections 40 of the punch 36 without the sheet of magnetic material 12 and the carrier 20 positioned therebetween.

The projections 40 on the punch 36 are preferably arranged in a matrix of rows and columns, and determine the pattern of magnetic material wafers to be formed in the surface 16 of the carrier 20. To form the pattern of the wafers in the surface 16, the unheated punch 36 is driven downward an amount which is sufficient to engage with each projection 40 the thin sheet of vicalloy material 12, to punch out and remove with each projection a wafer of the vicalloy material, and to embed the wafer into the surface 16 of the malleable carrier 20. During the punching of the sheet of vicalloy material 12, the malleable carrier 20 acts as a die for the sheet of vicalloy to impart shearing stresses to the material for removal of individual wafers therefrom for being embedded into the surface 16 of the carrier 20. Also during the time that the carrier 20 acts as a die for the vicalloy material 12, the planar die 28, which supports the malleable carrier 20, receives within the apertures 32 thereof extruded portions of the carrier 20 as individual wafers of the vicalloy material are embedded into the carrier 20 thereabove. It is to be appreciated that the wafers removed by the projections 40 of the punch 36 may be of any shape as determined by the configuration of the ends of the projections 40, and for the purpose of describing the invention shall be regarded as being square in shape. However, the wafers could have a circular or a triangular shape, the shape being mainly a matter of choice.

As shown in FIG. 2, a plurality of wafers 44 of magnetic material, or vicalloy 12, have been embedded into the surface 16 of the malleable carrier 20. Preferably, each wafer 44 is embedded into the carrier 20 with the upper surface of the wafer flush, or in a coplanar relationship, with the surface 16 of the carrier 20, so that the wafers are secured to the surface of the carrier 20 with sufficient force to prevent their accidentally being displaced therefrom. To accomplish this, an individual displaced portion, or nub 48, of the carrier 20 beneath each wafer 44 embedded into the surface 16 is extruded into an aperture 32 of the die 28 as the material beneath the wafer is displaced downwardly by the action of the projections 40 of the punch 36 on the wafer. This facilitates entry of each wafer 44 into the carrier 20, under the action of the punch 36, by providing an area into which the material beneath each wafer may be extruded, so that the edges of each wafer 44 are compressively surrounded by the material of the carrier 20 to secure each wafer within the surface 16 of the carrier 20.

FIG. 3 shows a typical pattern of individual, uniform size, square vicalloy wafers 44 embedded into the surface 16 of the carrier 20 in a coordinate array, or a matrix array, at the intersections of rows and columns after the sheet of vicalloy 12 and the malleable carrier 20 have been operated upon by the punch 36 and the die 28.

FIG. 4 shows the wafer embedded carrier 20 of FIG. 3 positioned wafer side down on a layer, or coating, of an adhesive 52 on a surface 54 of a substrate 56. The substrate 56, which is to receive on the adhesive coated surface 54 thereof the plurality of wafers 44 from the carrier 20, may be of any material having a magnetic permeability which is insignificant with respect to the permeability of the vicalloy wafers 44, and is preferably comprised of aluminum. A surface 58 of the substrate 56, opposite from the adhesive coated surface 54, rests upon an unheated, or ambient temperature planar die 60. A multiprojectioned punch 64, which may be the same punch 36 as was employed to embed the pattern of vicalloy wafers 44 into the carrier 20 if the wafer pattern exhibits reverse symmetry, is positioned above the wafer embedded carrier 20 with each projection 68 thereof in axial alignment with an individual one of the wafers 44, and therefore in axial alignment with an individual one of the nubs 48. In other words, the orientation of the wafer embedded carrier 20 on the adhesive 52 on the surface 54 of the substrate 56 with respect to the punch 64 is such that upon operation of the punch 64 by a press (not shown) to move the punch 64 downwardly toward the wafer embedded carrier 20, each projection of the plurality of projections 68 will be brought to bear against an individual one of the nubs 48 of the carrier 20.

To transfer the wafers 44 from the carrier 20 to the adhesive coated surface 54 of the substrate 56, the punch 64 is driven downward an amount which is sufficient to engage, with each projection 68, an individual one of the nubs 48, and to push, through the action of the projections 68 on the nubs 48, the wafers out of the carrier 20, into the adhesive 52, and against the surface 54 of the substrate 56. It is to be noted that the wafers 44 embedded in the carrier 20 are merely pressed, through the pushing action of the projections 68 on the nubs 48, out of the carrier 20, into the adhesive 52, and against the surface 54, and that the wafers are not embedded into the surface 54 of the substrate 56. This prevents any warpage of the substrate 56 which could occur if the wafers 44 were actually embedded into the surface 54 thereof.

Preferably, the adhesive 52 is a rubber base adhesive such as Catalog No. X1160 Pressure Sensitive Adhesive sold by the 3M Company of St. Paul, Minn., and the curing or setting time thereof may be accerated by the application of heat thereto. In use, the adhesive 52 on the surface 54 is initially partially cured to increase the viscosity thereof at the time that the wafers 44 are embedded therein to prevent movement, or "swimming," of the wafers in the adhesive as they are removed from the carrier 20. Also, to facilitate the removal of the wafers 44 from the surface 16 of the carrier 20, the projections 68 of the punch 64 may have an end area which is smaller than the end area of the projections 40 of the punch 36. In this manner, the end area of the projections 68 will be smaller than the area of the wafers 44, so that each projection 68 exerts a force on a nub 48 which is squarely centered over a corresponding underlying wafer 44.

After the wafers 44 are punched from the carrier 20 and pressed into the adhesive 52 on the surface 54 of the substrate 56, the carrier 20 is peeled away from both the adhesive and the wafers 44 adhesively secured therein, to leave on the surface 54 of the aluminum substrate 56 the pattern of vicalloy wafers 44. To facilitate removal of the carrier 20 from the adhesive 52, the surface 16 thereof is preferably initially provided with a silicone coating to prevent adhesion of the surface to the adhesive 52.

After the carrier 20 has been removed, or peeled, from the substrate 56 to leave the pattern of wafers 44 on the adhesive coated surface 54 thereof, the substrate, if the adhesive 52 is of the heat curable type, is heated in an oven (not shown) to complete the curing of the adhesive 52 to firmly secure the vicalloy wafers 44 therein and on the surface 54 of the substrate 56 in the desired pattern. At this point, to protect against damage or contamination of the exposed surface of each wafer 44, a sealer, such as a thin polyester film, may be laminated over the wafers 44 on the substrate 56. The substrate 56, with the wafers 44 on the surface thereof in the desired pattern, is now ready to have wires extended across the wafers for "reading" information which is first magnetically programmed into the wafers.

Normally, in the fabrication of a magnetic memory circuit card, the wafers 44 on the surface 54 of the substrate 56 cover approximately 8% of the total area of the surface of the substrate. Therefore, if the sheet of magnetic material, or vicalloy 12, has approximately the same surface area as the surface 54, when the punch 36 removes the wafers 44 from the sheet of vicalloy 12 only 8% of the vicalloy is removed. To avoid wasting the remaining 92% of the sheet of vicalloy, the sheet may be sequentially positioned across the surfaces 16 of additional carriers 20 with a virgin, or unpunched, area of the sheet presented to the projections 40 upon each operation of the punch 36. In this manner, additional vicalloy wafers 44 may be obtained from the sheet 12 to optimize the number of substrates 56 which may receive wafers 44 from a single sheet of magnetic material 12.

While one embodiment of the invention has been described in detail, it is to be understood that other modifications and embodiments may be devised by one skilled in the art without departing from the spirit and scope of the invention. For example, while the invention has been described with respect to the positioning of an array of vicalloy wafers on a surface of an aluminum substrate, the invention may just as readily find utility in the positioning of a pattern of any other type of a first material, other than vicalloy, which is removed from a sheet of the first material, on a surface of a second material, other than an aluminum substrate.

What is claimed is:

1. In a method of forming a pattern of a first material on an adhesive coated surface of a second material:
   pressing the pattern of the first material directly against a surface of a sheet of malleable material to deform the malleable material to secure the pattern within the surface thereof;
   placing the pattern bearing surface of the malleable material over the adhesive coated surface of the second material, and
   pressing a surface of the malleable material, opposite from the pattern bearing surface, to force the pattern of the first material from the surface of the malleable material and into the adhesive on the surface of the second material.

2. In a method of forming a pattern of wafers of a first material on an adhesive coated surface of a second material:
   pressing wafers of the first material directly against a surface of a sheet of a malleable material with a force sufficient to embed the wafers into the surface of the malleable material and to secure the wafers therein by deforming the malleable material to compressively surround the edges of the wafers;
   placing the wafer bearing surface of the malleable material over the adhesive coated surface of the second material, and
   pressing a surface of the malleable material, opposite from the wafer bearing surface, to move the wafers from the surface of the malleable material and into the adhesive on the surface of the second material.

3. In a method as set forth in claim 2, wherein pressing wafers of the first material against the surface of the sheet of malleable material includes:
   overlying a sheet of the first material in direct contact with a first surface of the malleable material;
   positioning the opposite surface of the malleable material on a surface of a die having apertures formed therein in a pattern which corresponds with the wafer pattern, and
   striking the sheet of the first material with a punch to remove the pattern of wafers from the sheet, to embed the wafers into the first surface of the malleable material and to secure the wafers therein by deforming the malleable material to compressively surround the edges of the wafers, and to extrude nub portions of the second surface of the malleable material beneath the wafers into the apertures as the wafers are embedded into the first surface thereof.

4. In a method as set forth in claim 3, wherein moving the wafers from the surface of the malleable material into the adhesive on the second material includes:
   overlying the wafer embedded first surface of the malleable material over and against the adhesive on the surface of the second material, and
   striking the nubs on the second surface of the malleable material with a punch to force the wafers from the first surface thereof and through the adhesive and into engagement with the surface of the second material.

5. In a method as set forth in claim 4, wherein the first surface of the malleable material is coated with an adhesive resistant material, the further step of:
   peeling the malleable material from both the wafers and the adhesive coated surface of the second material, after the wafers of the first material have been forced from the first surface of the malleable material, to form the pattern of wafers of the first material on the adhesive coated surface of the second material.

6. In a method of manufacturing a circuit card of the type wherein a circuit pattern of discrete wafers of a magnetic material are secured on an adhesive coated surface of a substrate having a magnetic permeability which is insignificant with respect to the permeability of the wafers:
   positioning a sheet of a malleable carrier material between a punch having a raised pattern in the form of the circuit pattern, and a rigid, planar die having apertures formed therein in the form of the circuit pattern and in alignment with the corresponding raised pattern of the punch for cooperation therewith;
   positioning a sheet of the magnetic material between the punch and the carrier material and in direct contact with a first surface of the carrier material;
   imparting relative movement to the punch and the die to apply the pattern of the punch against the sheet of magnetic material to cut the circuit pattern of discrete wafers therefrom as the sheet is pressed between the pattern of the punch and the carrier material, to embed the circuit pattern of wafers into the surface of the carrier by displacing the carrier material therebeneath, to secure the circuit pattern therein by deforming the carrier material to compressively surround the edges of the wafers, and to extrude displaced portions of an opposite second surface of the carrier material, underlying the embedded circuit pattern of wafers, into the apertures formed in the die;
   placing the wafer embedded first surface of the carrier material over the adhesive coated surface of the substrate in an essentially planar relationship therewith;
   positioning the carrier material and the substrate between a punch and a die with a surface of the substrate opposite from the adhesive coated surface resting on the die and with the punch having a raised pattern in a form to engage the second surface of the malleable material at the displaced portions thereof over areas opposite from the circuit pattern on the first surface thereof;
   imparting relative movement to the punch and the die to apply the pattern of the punch against the displaced portions on the second surface of the carrier to force the wafers from the first surface thereof and onto the adhesive on the surface of the substrate as the carrier is pressed between the pattern of the punch and the substrate, and to move the wafers through the adhesive and into engagement with the surface of the substrate to adhesively secure the wafers to the surface of the substrate, and
   removing the carrier material from the adhesive coated surface of the substrate to strip the wafers, adhesively secured to the substrate, from the first surface of the carrier, whereby the circuit pattern of discrete wafers of the magnetic material is adhesively secured to the surface of the substrate.

7. In a method as set forth in claim 6, wherein the adhesive on the substrate is a type which is curable upon being subjected to heat, the further steps of:

heating the substrate with the wafers adhesively secured to the surface thereof, after the carrier material has been removed therefrom, to cure the adhesive to securely affix the wafers to the substrate, and applying a sealer across the wafers on the surface of the substrate.

8. In a method of forming arrays of magnetic material wafers on surfaces of substrates, the steps of:
1. positioning a sheet of magnetic material in direct contact with a deformable carrier sheet;
2. punching from the sheet of magnetic material and embedding into the deformable carrier sheet a coordinate array of magnetic material wafers, wherein the wafers are spaced across the carrier sheet and constitute less than half the area of the sheet of magnetic material;
3. punching and transferring the coordinate array of wafers from the carrier and onto an adhesive coated substrate to form a coordinate array of magnetic material wafers on the substrate;
4. repositioning the sheet of magnetic material over the carrier for a subsequent punching of a second coordinate array of wafers from the unpunched areas of the sheet of magnetic material between the punched areas and for the embedding of the second coordinate array of wafers into the carrier, and
5. repeating the second and third steps to form a second coordinate array of wafers on a second substrate.

9. In a method of forming a pattern of a first material on a surface of a second material:

pressing the pattern of the first material directly against a surface of a sheet of malleable material to deform the malleable material to secure the pattern within the surface thereof;

placing the pattern bearing surface of the malleable material over the surface of the second material;

pressing a surface of the malleable material, opposite from the pattern bearing surface, to force the pattern of the first material from the surface of the malleable material and against the surface of the second material, and adhesively securing the pattern of the first material to the surface of the second material.

10. In a method of forming an array of magnetic elements on a substrate:

placing a sheet of malleable material on a die having a planar surface into which is formed an array of die apertures corresponding to the desired array of magnetic elements;

placing a sheet of magnetic material over and in direct contact with the sheet of malleable material, the magnetic material characterized in that it may be pressed against the malleable material to deform the malleable material;

applying a pattern of punching forces corresponding to the array of die apertures to the sheet of magnetic material to shear elements from the sheet of magnetic material and to embed the elements within the malleable sheet by extruding portions of the malleable sheet into the die apertures to form an array of nubs and to force the malleable material about the periphery of the embedded elements to compressively secure the magnetic elements within the sheet of malleable material;

placing the sheet of malleable material on an adhesive coated substrate with the embedded elements on the adhesive;

applying a pattern of punching forces to the nubs to push the elements from the sheet of malleable material and into firm engagement with the adhesive, and removing the sheet of malleable material to leave the array of magnetic elements on the substrate.

* * * * *